(12) United States Patent
Wu et al.

(10) Patent No.: US 7,551,113 B2
(45) Date of Patent: Jun. 23, 2009

(54) CYCLIC DIGITAL TO ANALOG CONVERTER IN PIPELINE STRUCTURE

(75) Inventors: Zhong-yuan Wu, Suwon-si (KR); Yoon-kyung Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/038,852

(22) Filed: Feb. 28, 2008

(65) Prior Publication Data

US 2008/0238748 A1 Oct. 2, 2008

(30) Foreign Application Priority Data

Mar. 27, 2007 (KR) .................. 10-2007-0030046

(51) Int. Cl.
*H03M 1/66* (2006.01)
(52) U.S. Cl. ........................................ 341/150; 345/89
(58) Field of Classification Search ......... 341/140–155; 345/89–100
See application file for complete search history.

(56) References Cited

U.S. PATENT DOCUMENTS

| | | | |
|---|---|---|---|
| 5,696,509 A | 12/1997 | Maejima | |
| 6,498,596 B1 * | 12/2002 | Nakamura et al. | 341/150 |
| 6,778,121 B2 * | 8/2004 | Manganaro | 341/150 |
| 6,838,930 B2 * | 1/2005 | Huynh | 330/9 |
| 7,102,557 B1 * | 9/2006 | Frith | 341/150 |
| 7,355,582 B1 * | 4/2008 | Bell | 345/100 |
| 7,423,558 B2 * | 9/2008 | Ueno | 341/144 |
| 7,425,913 B2 * | 9/2008 | Wu et al. | 341/150 |
| 2003/0155967 A1 | 8/2003 | Fujimoto | |
| 2003/0201923 A1 | 10/2003 | Uno | |
| 2006/0139195 A1 | 6/2006 | Casper et al. | |

FOREIGN PATENT DOCUMENTS

| | | |
|---|---|---|
| JP | 11-298329 | 10/1999 |
| JP | 2001-094426 | 4/2001 |

* cited by examiner

*Primary Examiner*—Lam T Mai
(74) *Attorney, Agent, or Firm*—Volentine & Whitt, P.L.L.C.

(57) ABSTRACT

A cyclic digital to analog converter (CDAC) in a pipeline structure includes a first CDAC block and a second CDAC block. The first CDAC block receives a first digital signal and converts the first digital signal to a first analog value. The first CDAC block includes a charging capacitor for charging according to the first digital signal and a first storing capacitor for storing the first analog value. The second CDAC block receives a second digital signal and converts the second digital signal to a second analog value. The second CDAC block includes the charging capacitor for charging according to the second digital signal and a second storing capacitor for storing the second analog value. The first CDAC block and the second CDAC block share the charging capacitor.

28 Claims, 9 Drawing Sheets

US 7,551,113 B2

CYCLIC DIGITAL TO ANALOG CONVERTER IN PIPELINE STRUCTURE

CROSS-REFERENCE TO RELATED PATENT APPLICATION

A claim of priority is made to Korean Patent Application No. 10-2007-0030046, filed on Mar. 27, 2007, subject matter of which is hereby incorporated by reference.

BACKGROUND OF THE INVENTION

1. Field of the Invention

The present invention relates to a cyclic digital to analog converter, and more particularly, to a cyclic digital to analog converter in a pipeline structure having a shared charging capacitor.

2. Description of the Related Art

A cyclic digital to analog converter (CDAC) may be referred to as a cyclic switched capacitor digital to analog converter or a CDAC.

FIG. 1 is a diagram illustrating a conventional CDAC 100. Referring to FIG. 1, the CDAC 100 includes a CDAC core cell 110, an amplifier unit 130 and an output terminal 160. The CDAC 100 also includes switches S_1, S1_2, S2, S3, S4 and S5, three capacitors C1, C2 and C3, and an amplifier 150.

The CDAC core cell 110 may internally include an input unit 105. The input unit 105 receives a uniform level voltage VREF from one terminal and receives a ground voltage GND from another terminal. Here, the uniform level voltage VREF corresponds to a digital signal in a logic high level and the ground voltage GND corresponds to a digital signal in a logic low level.

When the digital signal in a logic high level is applied, a first input switch S1_1 is turned on (closed or connected), and the uniform level voltage VREF is transmitted to a first node N1. When the digital signal in a logic low level is applied, a second input switch S1_2 is turned on, and the ground voltage GND is transmitted to the first node N1.

When the uniform level voltage VREF or the ground voltage GND is applied to the first node N1, the first capacitor C1 charges according to the applied voltage. The second capacitor C2 is initially charged in a uniform initial value.

When the charging of the first capacitor C1 is complete, the second switch S2 is turned on. When the second switch S2 is turned on, charges in the first capacitor C1 and the second capacitor C2 are shared, and thus values of voltages in the first node N1 and a second node N2 are equalized. The second switch S2 is then turned off (opened or disconnected). Even when the second switch S2 is turned off, the equalized values of the voltages are maintained in the second node N2. As such, the charging and sharing operations are repeated until the least significant bit (LSB) to the most significant bit (MSB) of an input digital signal are all input.

In order to initialize the third capacitor C3, the fifth switch S5 is turned on for a very short time and then turned off. Continuously, the fourth switch S4 is turned on. The value of the voltage stored in the second node N2 is differentially output through the amplifier 150. The charges stored in the second capacitor C2 is transmitted to the third capacitor C3. Then, an analog voltage is output through an output terminal of the amplifier 150, and is driven to a load terminal of the output terminal 160.

Here, a uniform reference voltage VCOM is input to a − input terminal IN− of the amplifier 150. The uniform reference voltage VCOM has a value within an operation voltage range of the amplifier 150, and the value may vary according to the design specifications of the CDAC. The amplifier 150 differentially amplifies and outputs the uniform reference voltage VCOM and the voltage stored in the second node N2.

When the fourth switch S4 is turned on, a charge injection error is generated in the CDAC 100. The charge injection error is generated when the amount of currents flowing through both ends (i.e., terminals) of the fourth switch S4 are not in accord. When the fourth switch S4 is turned on, a charge flows into the fourth switch S4. The charge inflow differentiates the amount of currents flowing through the both terminals of the fourth switch S4, and accordingly, voltage levels of both terminals of the fourth switch S4 are different. The charge injection error or a non-linear charge injection error occurs when voltages of both terminals of a switch are different due to a charge inflow, even though the voltages should be the same when the switch is turned on.

Also, a mismatch between the second capacitor C2 and the third capacitor C3 affects an accuracy of the CDAC 100. The accuracy of the CDAC 100 is indicated by whether the CDAC 100 outputs a value of the analog voltage that accurately corresponds to a certain digital signal input. For example, when a four bit digital signal of 1101 is input, a value of the corresponding analog voltage should be $13/16$. How close the value of the analog voltage is to $13/16$ indicates the accuracy of the CDAC 100.

Hereinafter, an operation frequency of the CDAC 100 will be described. An operation cycle of the CDAC 100 includes a calculation period, which is a calculation performance period for changing a digital value to an analog value, and an amplifier settling period. In order to satisfy a target speed, the operation frequency of the CDAC 100 and a slew rate of the amplifier 150 should both increase. The increase of the operation frequency causes a larger bias current and power consumption. In a column driver of an LCD panel, for example, hundreds of CDACs 100 should be installed. Accordingly, a larger power consumption of each CDAC 100 leads to much larger overall power consumption of the entire LCD. The CDAC 100 illustrated in FIG. 1 is described in detail, for example, in U.S. Pat. No. 5,696,509, issued Dec. 9, 1997.

FIG. 2A is a diagram illustrating a conventional CDAC 200 in a pipeline structure. FIG. 2B is a diagram illustrating operations of the conventional CDAC 200 of FIG. 2A. Hereinafter, the conventional CDAC 200 in the pipeline structure will be described with reference to both FIGS. 2A and 2B.

In order to address the increase of the operation frequency and large power consumption of the CDAC 100 illustrated in FIG. 1, the pipeline structure of FIG. 2A may be used.

Referring to FIG. 2A, the CDAC 200 in the pipeline structure includes two CDACs. That is, each of a first CDAC block 220 and a second CDAC block 230 may be the CDAC 100 of FIG. 1.

When the first CDAC block 220 receives a digital signal and converts the digital signal to an analog value in the pipeline structure, the second CDAC 230 outputs a value which was pre-converted to an analog value. A first switch S1 201 and a fourth switch S4 204 are simultaneously turned on, and a second switch S2 202 and a third switch S3 203 are simultaneously turned on.

Referring to a time interval t2, during which the first switch S1 201 and the fourth switch S4 204 are turned on, the first CDAC block 220 (CDAC_1) receives a digital signal D3, and performs a calculation in order to convert the digital signal D3 to an analog value in operation 265. Simultaneously, the second CDAC 230 (CDAC_2) outputs a pre-calculated analog value to an output terminal Dout through the fourth switch S4 204 in operation 273.

Referring to a time interval t3, during which the second switch S2 202 and the third switch S3 203 are turned on, the first CDAC block 220 (CDAC_1) outputs the analog value of the digital signal D3 calculated in the time interval t2 through the third switch S3 203 in operation 267. Simultaneously, the second CDAC 230 (CDAC_2) receives a new digital signal D4 and performs a calculation in order to convert the digital signal D4 to an analog value in operation 275.

In the CDAC 200 in a pipeline structure, the two CDACs, i.e., the first CDAC block 220 and the second CDAC block 230, operate in a pipeline mode as illustrated in FIGS. 2A and 2B. Accordingly, calculation and output operations of the 200 CDAC can be performed throughout the entire cyclic period. Consequently, operation frequency of the CDAC 200 and pressure on the speed of an amplifier can be reduced. Also, large power consumption due to increase of the operation frequency can be reduced. Thus, the CDAC 200 in a pipeline structure addresses to some extent the problem of large power consumption in the CDAC 100 of FIG. 1.

However, the CDAC 200 in a pipeline structure separately uses two entirely independent CDAC blocks, CDAC block 220 and CDAC block 230. Accordingly, the size of the CDAC 200 is twice the size of the CDAC 100. In an LCD driver, the size of a CDAC is an important factor in determining the ultimate size of the LCD driver. Therefore, using a larger CDAC is against the current trend toward smaller LCDs. In addition, the charge injection error described above still occurs in the CDAC 200.

SUMMARY OF THE INVENTION

According to an aspect of the present invention, there is provided a cyclic digital to analog converter (CDAC) in a pipeline structure. The CDAC includes a first CDAC block and a second CDAC block. The first CDAC block receives a first digital signal and converts the first digital signal to a first analog value. The first CDAC block includes a charging capacitor for charging according to the first digital signal and a first storing capacitor for storing the first analog value. The second CDAC block receives a second digital signal and converts the second digital signal to a second analog value. The second CDAC block includes the charging capacitor for charging according to the second digital signal and a second storing capacitor for storing the second analog value. The first CDAC block and the second CDAC block share the charging capacitor.

The first digital signal and the second digital signal may be consecutively received. The second CDAC block may output the second analog value while the first CDAC block receives the first digital signal and calculates the first analog value, or the first CDAC block may output the first analog value while the second CDAC block receives the second digital signal and calculates the second analog value.

The CDAC may further include an amplifier which receives, amplifies and outputs a reference voltage signal and at least one of the first analog value and the second analog value output from the first CDAC block and the second CDAC block, respectively. The CDAC may also include switches respectively connecting the first CDAC block and the second CDAC block to an output terminal of the amplifier. The switches may be turned on or turned off in response to corresponding switching control signals.

The CDAC may further include an input unit connected to the charging capacitor. The input unit receives the first digital signal and the second digital signal, and sends the received first and second digital signals to the first CDAC block and the second CDAC block, respectively. Each of the first digital signal and the second digital signal include one of a logic high level or a logic low level.

The first CDAC block may further include an eighth switch connected between a sixth node and the first storing capacitor, the eighth switch being turned on or off in response to an eighth switching control signal; a fourth switch connected between a first node and the first storing capacitor, the fourth switch being turned on or off in response to a fourth switching control signal; and a sixth switch connected between the first storing capacitor and a second input terminal of the amplifier, the sixth switch being turned on or off in response to a sixth switching control signal. The charging capacitor may be connected between the first node, which receives the first digital signal and the second digital signal, and the sixth node, which is an input terminal of the amplifier. The first CDAC block may also include an eleventh switch connected between the charging capacitor and the sixth node, where the eleventh switch is regulated to be always turned on while the CDAC operates.

The second CDAC block may include a seventh switch connected between the sixth node and the second storing capacitor, the seventh switch being turned on or off in response to a seventh switching control signal; a third switch connected between the first node and the second storing capacitor, the third switch being turned on or off in response to a third switching control signal; and a fifth switch connected between the seventh switch and the second input terminal of the amplifier, the fifth switch being turned on or off in response to a fifth switching control signal.

The first input terminal of the amplifier may receive a reference voltage, which has a value within an operation voltage range of the amplifier. The reference voltage value may include an intermediate value of the operation voltage range.

The CDAC may further include a ninth switch connected between the second storing capacitor and an output terminal of the amplifier. The ninth switch may include an output node of the second CDAC block. A tenth switch may be connected between the first storing capacitor and the output terminal of the amplifier. The tenth switch may include an output node of the first CDAC block. Also, the input unit may include a first switch connected between a low voltage level signal source and the charging capacitor, the first switch being turned on or off in response to a first switching control signal; and a second switch connected between a high voltage level signal source and the charging capacitor, the second switch being turned on or off in response to a second switching control signal.

The third through tenth switching control signals may be supplied from an LCD controller or be individually input, and respectively regulate the third through tenth switches according to an operation status of the CDAC. Each of the third though tenth switches may include an NMOS transistor, a PMOS transistor or a transmission gate. The fifth, sixth and eighth switches may be identical MOS transistors or identical transmission gates, for example.

According to another aspect of the present invention, there is provided a CDAC in a pipeline structure. The CDAC includes a first CDAC block, which receives a first digital signal and converts the first digital signal to a first analog value, and a second CDAC block, which receives a second digital signal and converts the second digital signal to a second analog value. The CDAC also includes an amplifier connectable to the first CDAC block and the second CDAC block. The amplifier receives the first analog value from the first CDAC block and the second analog value from the second CDAC block through an input terminal, and outputs an amplified analog value by differentially amplifying the received first analog value or the received second analog value with a reference voltage.

The first CDAC block includes a first capacitor having one terminal that receives the first digital signal and an other terminal connected to a sixth node, which receives the reference voltage, the first capacitor charging according to the first digital signal; a fourth switch having one terminal connected to the one terminal of the first capacitor; a second capacitor having one terminal connected to an other terminal of the fourth switch, the second capacitor storing the first analog value; a sixth switch having one terminal connected to an other terminal of the second capacitor and an other terminal connected to the amplifier input terminal; and an eighth switch having one terminal connected to the other terminal of the second capacitor and an other terminal connected to the sixth node. The second CDAC block includes the first capacitor, which receives the second digital signal and charges according to the second digital signal; a third switch having one terminal connected to the one terminal of the first capacitor; a third capacitor having one terminal connected to an other terminal of the third switch, the third capacitor storing the second analog value; a fifth switch having one terminal connected to an other terminal of the third capacitor and an other terminal connected to the amplifier input terminal; and a seventh switch having one terminal connected to the other terminal of the third capacitor and an other terminal connected to the sixth node.

The CDAC may further include a ninth switch having one terminal connected to the other terminal of the third switch and an other terminal connected to an output terminal of the amplifier. Also, the CDAC may include a tenth switch having one terminal connected to the other terminal of the fourth switch and an other terminal connected to the output terminal of the amplifier.

An operation cycle may include a first time interval and a second time interval, where the second time interval may follow the first time interval. The eighth switch may be turned off and the tenth switch is turned on during the first time interval, and the sixth switch may be turned on and the fifth switch may be turned off during the second time interval. A charge injection error occurring when the eighth switch is turned off during the first time interval, may be compensated for by charge injection errors respectively occurring when the fifth switch is turned off and the sixth switch is turned on during the second time interval.

The third though tenth switches may be turned on or off in response to third through tenth switching control signals, respectively. Also, the third through tenth switching control signals may be supplied from an LCD controller or individually input, and respectively regulate the third through tenth switches according to an operation status of the CDAC. The fifth and seventh switches may be on and the third, fourth, sixth and ninth switches may be off during the first time interval. The third, fourth and eighth switches may be off and the seventh and tenth switches may be on during the second time interval.

BRIEF DESCRIPTION OF THE DRAWINGS

The embodiments of the present invention will be described with reference to the attached drawings, in which:

FIG. 6A is a diagram illustrating a charge injection error occurring when a switch is turned on.

DETAILED DESCRIPTION OF THE EMBODIMENTS

Figure 1:
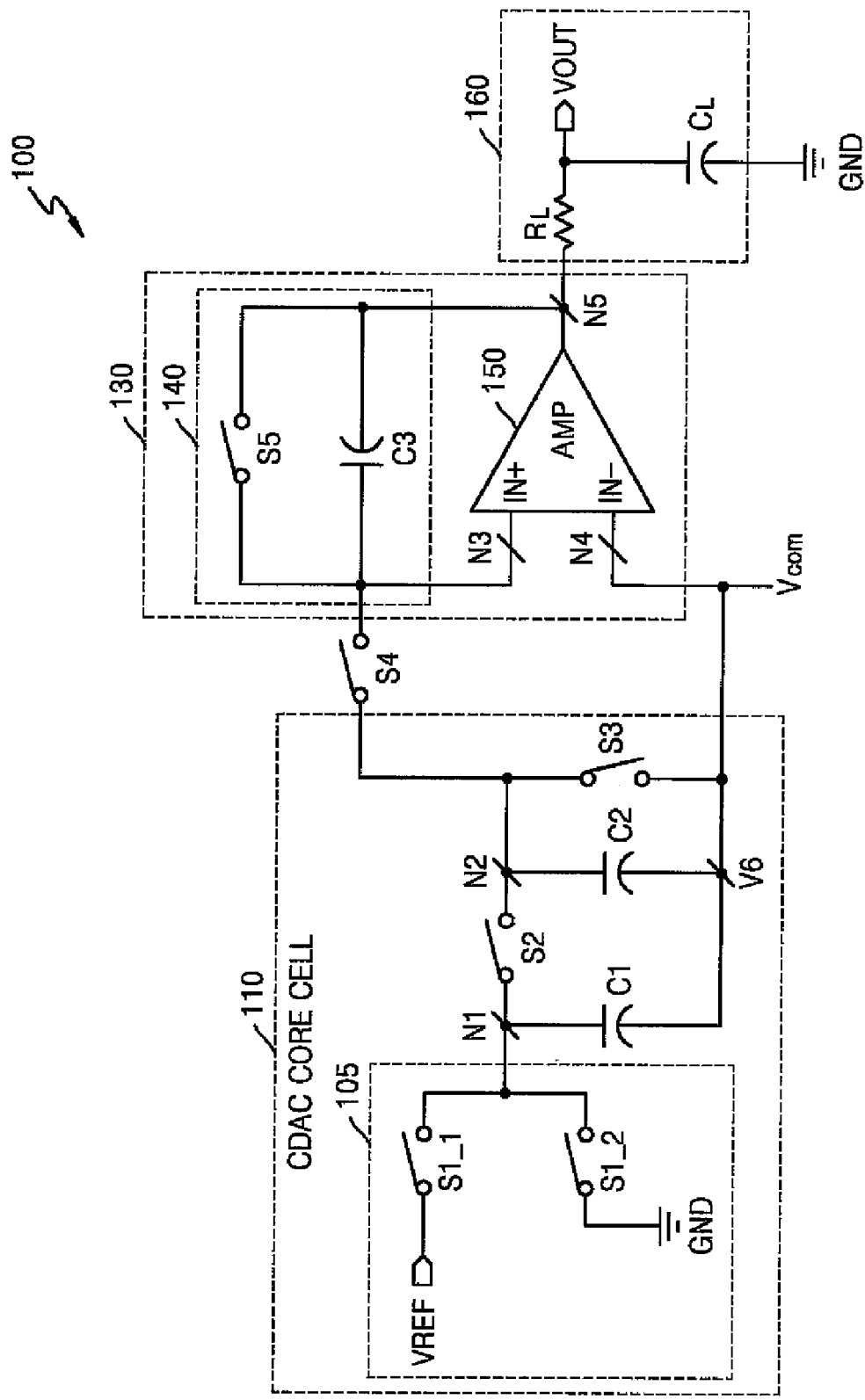
FIG. 1 is a diagram illustrating a conventional cyclic digital to analog converter.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Embodiments of the present invention provide a cyclic digital to analog converter (CDAC) in a pipeline structure, having a small size and reducing power consumption. Further, the CDAC in a pipeline structure can prevent a charge injection error, occurring during a transition period.

Figure 3:
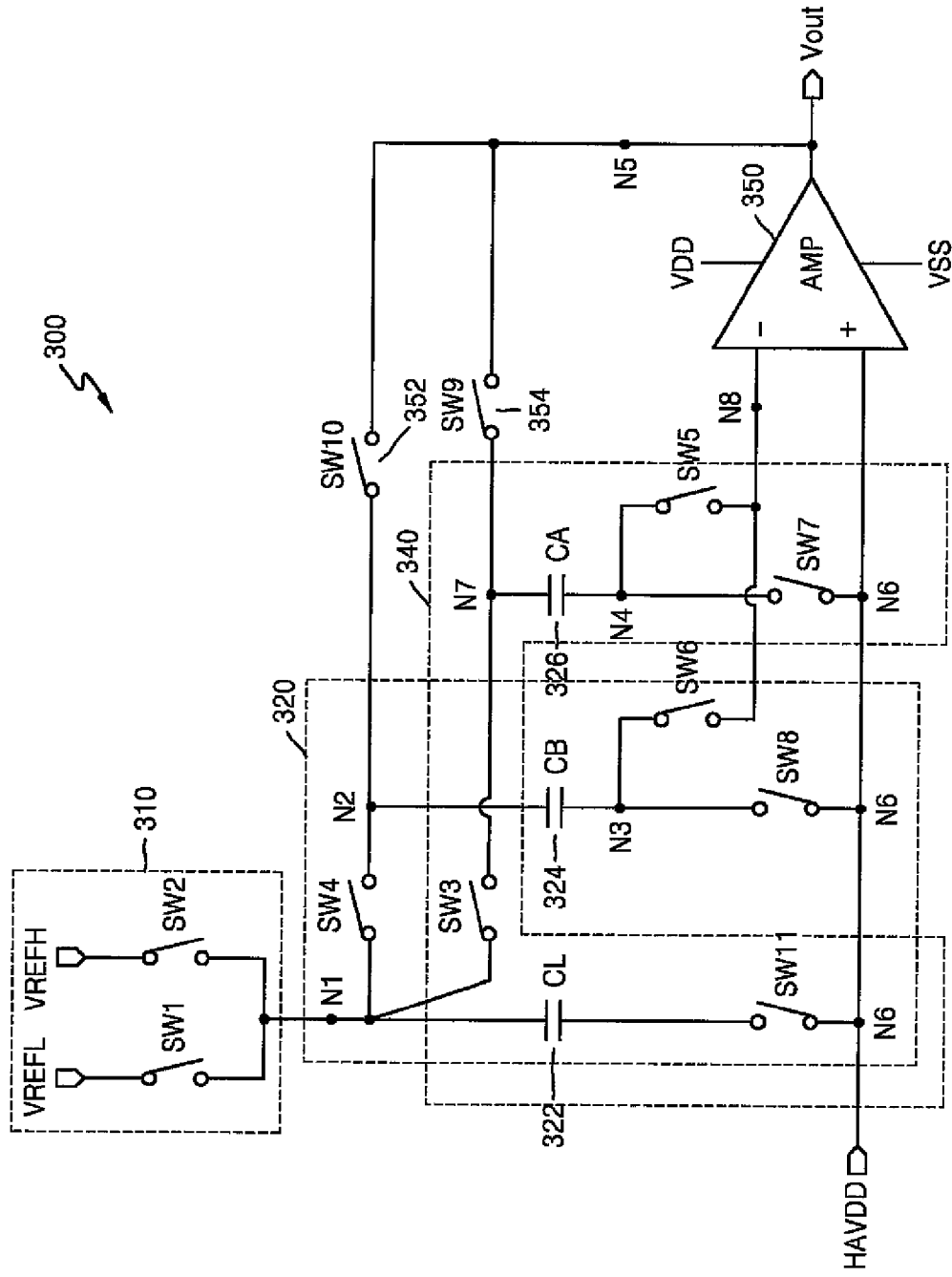
FIG. 3 is a diagram illustrating a cyclic digital to analog converter in a pipeline structure, according to an embodiment of the present invention.

FIG. 3 is a diagram illustrating a CDAC 300 in a pipeline structure according to an illustrative embodiment of the present invention.

Referring to FIG. 3, the CDAC 300 includes a first CDAC block 320 and a second CDAC block 340. Also, the CDAC 300 may further include an amplifier 350, a ninth switch SW9 354, a tenth switch SW10 352 and an input unit 310.

The input unit 310 includes a first switch SW1 and a second switch SW2. A low level voltage VREFL is input to a terminal of the first switch SW1 and high level voltage VREFH is input to a terminal of the second switch SW2.

The low level voltage VREFL is applied to correspond to a logic low "0" signal, and the high level voltage VREFH is applied to correspond to a logic high "1" signal. Accordingly, when the logic high "1" signal is applied, the second switch SW2 is turned on and thus the high level voltage VREFH is captured in a first node N1. However, when the logic low "0"

signal is applied, the first switch SW1 is turned on and the low level voltage VREFL is captured in the first node N1.

Multiple switches included in the first and second CDAC blocks 320 and 340 are third through eighth switches SW3, SW4, SW5, SW6, SW7 and SW8, and an eleventh switch SW11. For convenience, the fourth, sixth, eighth and eleventh switches SW4, SW6, SW8 and SW11 are included in the first CDAC block 320, and the third, fifth, seventh and eleventh switches SW3, SW5, SW7 and SW11 are included in the second CDAC block 340. As indicated, the CDAC 300 in a pipeline structure includes tenth switch SW10 352 and ninth switch SW9 354, which respectively connect the first CDA block 320 and the second CDAC block 340 to an output of the amplifier 350. In an embodiment, the tenth switch SW10 352 and ninth switch SW9 354 may be included in the first and second CDAC blocks 320 and 340, respectively.

The first CDAC block 320 includes a first capacitor 322, a second capacitor 324 and the switches identified above. The first capacitor 322 is a charging capacitor which stores a charge corresponding to a voltage captured in the first node N1.

In an embodiment, the eleventh switch SW11 is a dummy switch, which mimics the parasitic effects of the seventh switch SW7 and the eighth switch SW8. The eleventh switch SW11 is always on while the CDAC 300 operates in order to compensate for the parasitic mismatch. Accordingly, the eleventh switch SW11 is a dummy switch to show a parasitic component. Since the eleventh switch SW11 is a dummy switch, it need not necessarily be illustrated in FIG. 3.

The second capacitor 324 initially stores a predetermined amount of charges and thus the second node N2 has a predetermined voltage value. The second capacitor 324 is a storing capacitor. When the fourth switch SW4 is turned on, the first node N1 and the second N2 become the same node. An average amount of charges is then stored in the first capacitor 322 and in the second capacitor 324. In other words, the first and second capacitors 322 and 324 are equalized.

When the equalization of the first and second capacitors 322 and 324 is complete, an analog value of a voltage corresponding to an input digital value is captured in the second node N2. Also, the second capacitor 324 stores the analog value. That is, through the equalization, a digital signal is calculated and converted to an analog value.

The second CDAC block 340 includes the first capacitor 322, a third capacitor 326 and multiple switches. The second CDAC block 340 shares the first capacitor 322 with the first CDAC block 320. As in the first CDAC block 320, the first capacitor 322 is a charging capacitor, and thus stores a charge corresponding to an input digital signal.

The third capacitor 326 is a storing capacitor. Accordingly, as discussed with respect to the second capacitor 324 in the first CDAC block 320, the third capacitor 326 stores an analog voltage value when the input digital signal is calculated and converted to the analog value.

For example, when a four bit digital signal of 1101 is input, a corresponding value ($13/16$)*VREFH is captured at both ends or terminals of the third capacitor 326. Processes of calculating and outputting ($13/16$)*VREFH when the digital signal of 1101 is input is generally known to one of ordinary skill in the related art, and thus will not be specifically described herein.

In the CDAC 300 in a pipeline structure, the first CDAC block 320 receives a first digital signal and calculates a corresponding first analog value. Also, at the same time, the second CDAC block 340 outputs a second analog value of a second digital signal, which was input to the second CDAC block 340 before the first digital signal is input to the first CDAC block 320, to the amplifier 350.

Alternatively, the second CDAC block 340 may receive the second digital signal and calculate the corresponding second analog value, while at the same time, the first CDAC block 320 amplifies and outputs the first analog value of the first digital signal, which was input to the first CDAC block 320 before the second digital signal is input to the second CDAC block 340, to the amplifier 350.

The amplifier 350 receives the voltage of the second node N2 output from the first CDAC block 320 or the voltage of a seventh node N7 output from the second CDAC block 340 via a − input terminal and receives a reference voltage HAVDD via a + input terminal. The amplifier 350 differentially amplifies the voltage received via the − input terminal and the reference voltage HAVDD received via the + input terminal.

Here, the reference voltage HAVDD has a value within an operation voltage range of the amplifier 350. Generally, the reference voltage HAVDD has an intermediate value of the operation voltage range of the amplifier 350. The value of the reference voltage HAVDD may differ based on design specifications.

The third through tenth switches SW3 through SW10 are respectively turned on or turned off in response to third through tenth switching control signals. Since the eleventh switch SW11 is a dummy switch, the eleventh switch SW11 does not receive a switching control signal.

The third through tenth switching control signals may be supplied from an LCD controller or separately input externally by a user, for example. That is, the third through tenth switches SW3 to SW10 are suitably regulated to be turned on or off according to an operation status of the CDAC 300.

In various embodiments, the first through tenth switches SW1 to SW10 may be NMOS transistors, PMOS transistors or transmission gates.

Also, the fifth, sixth and eighth switches SW5, SW6 and SW8 are equivalent devices. For example, the fifth, sixth and eighth switches SW5, SW6 and SW8 may be NMOS transistors having the same specification or transmission gates having the same specification. Likewise, the fifth through eleventh switches SW5 through SW11 may be equivalent devices.

Figure 2A:
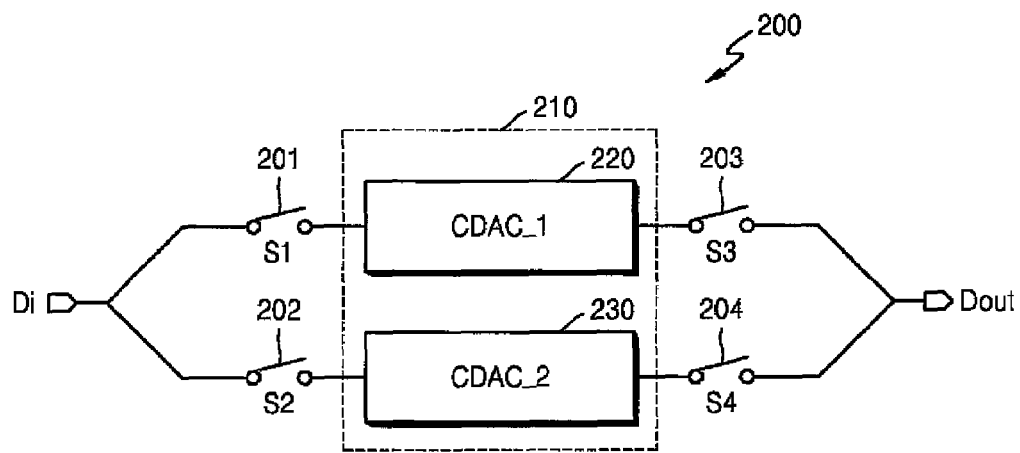
FIG. 2A is a diagram illustrating a conventional cyclic digital to analog converter in a pipeline structure.
Figure 2B:
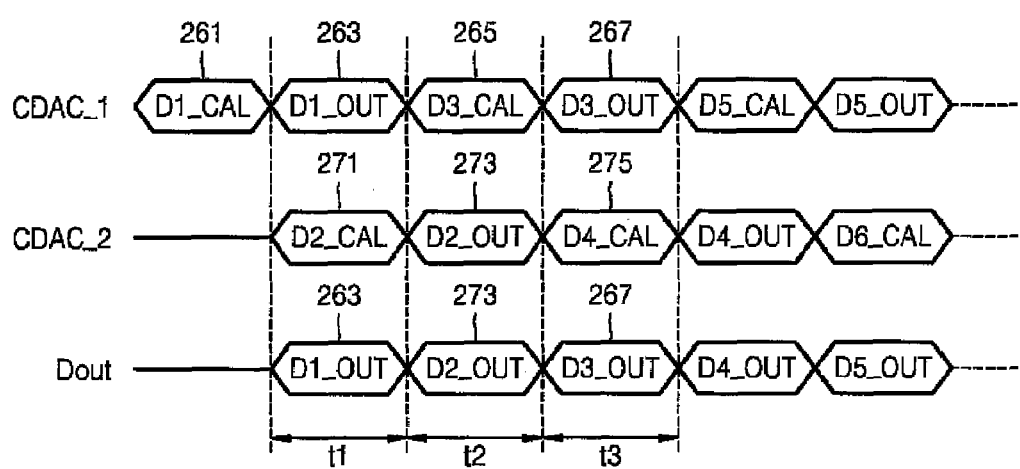
FIG. 2B is a diagram illustrating operations of the conventional cyclic digital to analog converter of FIG. 2A.

As described above, the CDAC 300 according to the illustrative embodiment is able operate similarly to the CDAC 200 of FIG. 2A, even though the CDAC 300 only has three capacitors, i.e., the first through third capacitors 322, 324 and 326. In other words, the CDAC 300 is substantially the same size as a single CDAC, but operates like a CDAC in a pipeline structure. Accordingly, using the pipeline structure, operation frequency and thus power consumption can be reduced.

Also, using the CDAC 300 can prevent a charge injection error. Operations of the CDAC 300 will be described with reference to FIGS. 4 and 5A through 5D.

Figure 4:
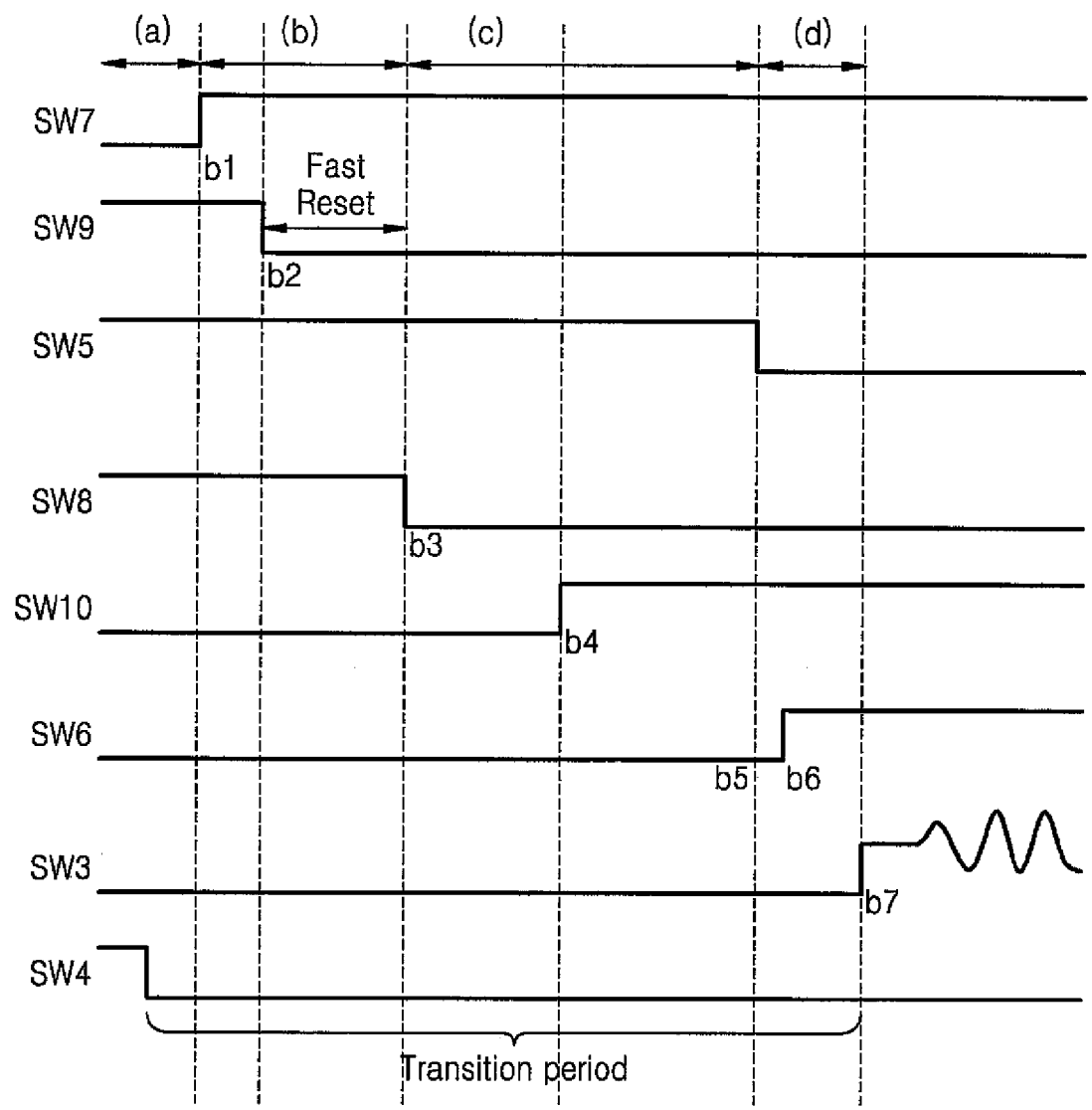
FIG. 4 is a timing diagram illustrating operations of the cyclic digital to analog converter of FIG. 3 in a transition period, according to an embodiment of the present invention.

FIG. 4 is a timing diagram illustrating operations of the CDAC 300 of FIG. 3 in a transition period. A logic high level means that a switch is turned on and a logic low level means that a switch is turned off.

Referring to FIG. 4, logic levels of the third through tenth switching control signals, during an operation cycle of the CDAC 300 according to an illustrative embodiment of the present invention, including the transition period, are shown. Upon receiving a digital signal, the first CDAC block 320 performs a calculation in order to convert the digital signal to an analog signal. In the depicted embodiment, the second CDAC block 320 samples and holds a pre-calculated analog value of voltage, and then outputs the analog value of voltage.

Figure 5A:
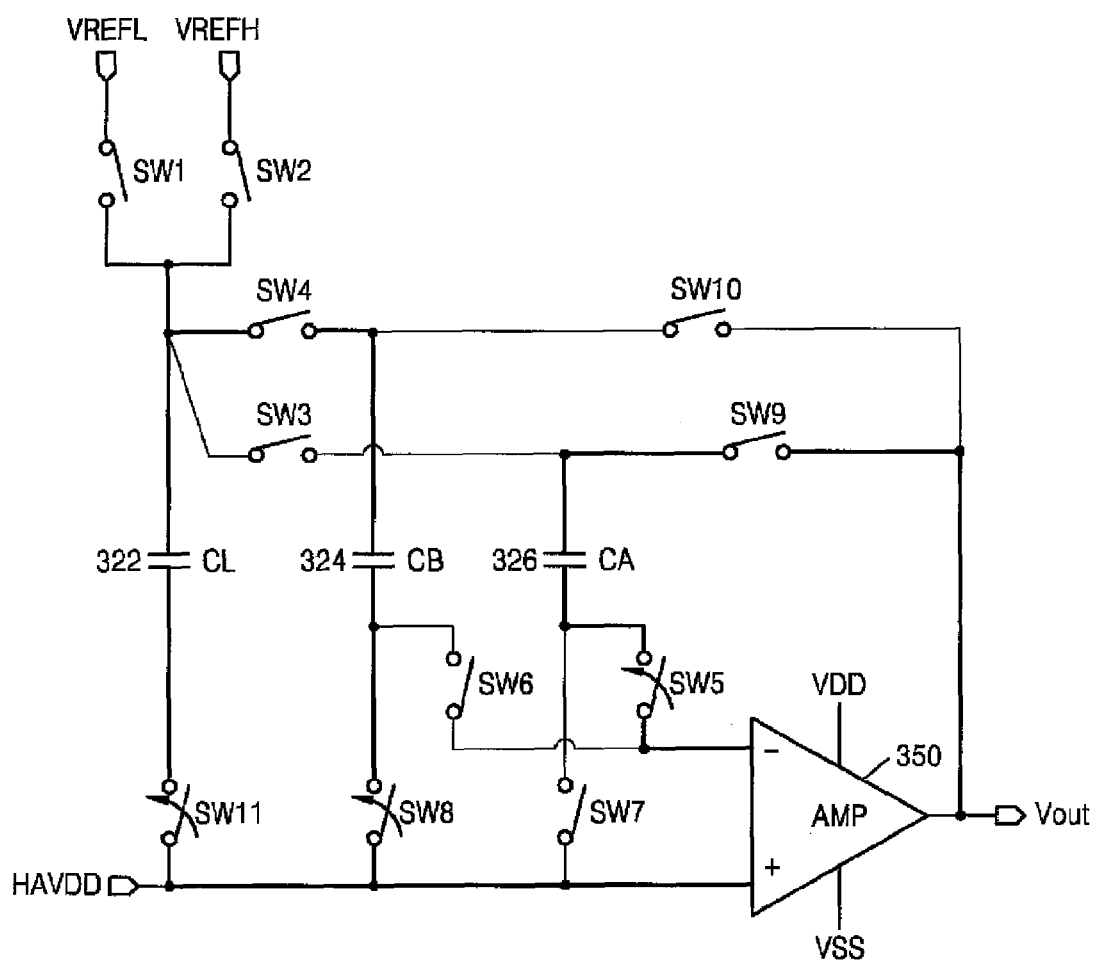
FIG. 5A is a diagram illustrating operations of the cyclic digital to analog converter illustrated in FIG. 3 during section (a) of FIG. 4, according to an embodiment of the present invention.

FIG. 5A is a diagram illustrating operations of the CDAC 300 of FIG. 3 during section (a) of FIG. 4. During the transition period, including sections (a) through section (d), the third switch SW3 and the fourth switch SW4 are both off.

Referring to FIGS. 4 and 5A, the fifth, eighth and ninth switches SW5, SW8 and SW9 are on and the sixth, seventh and tenth switches SW6, SW7 and SW10 are off.

The third capacitor 326 is connected to the – input terminal of the amplifier 350 as a feedback capacitor. Also, the third capacitor 326 amplifies and outputs a stored analog value of voltage.

Figure 5B:
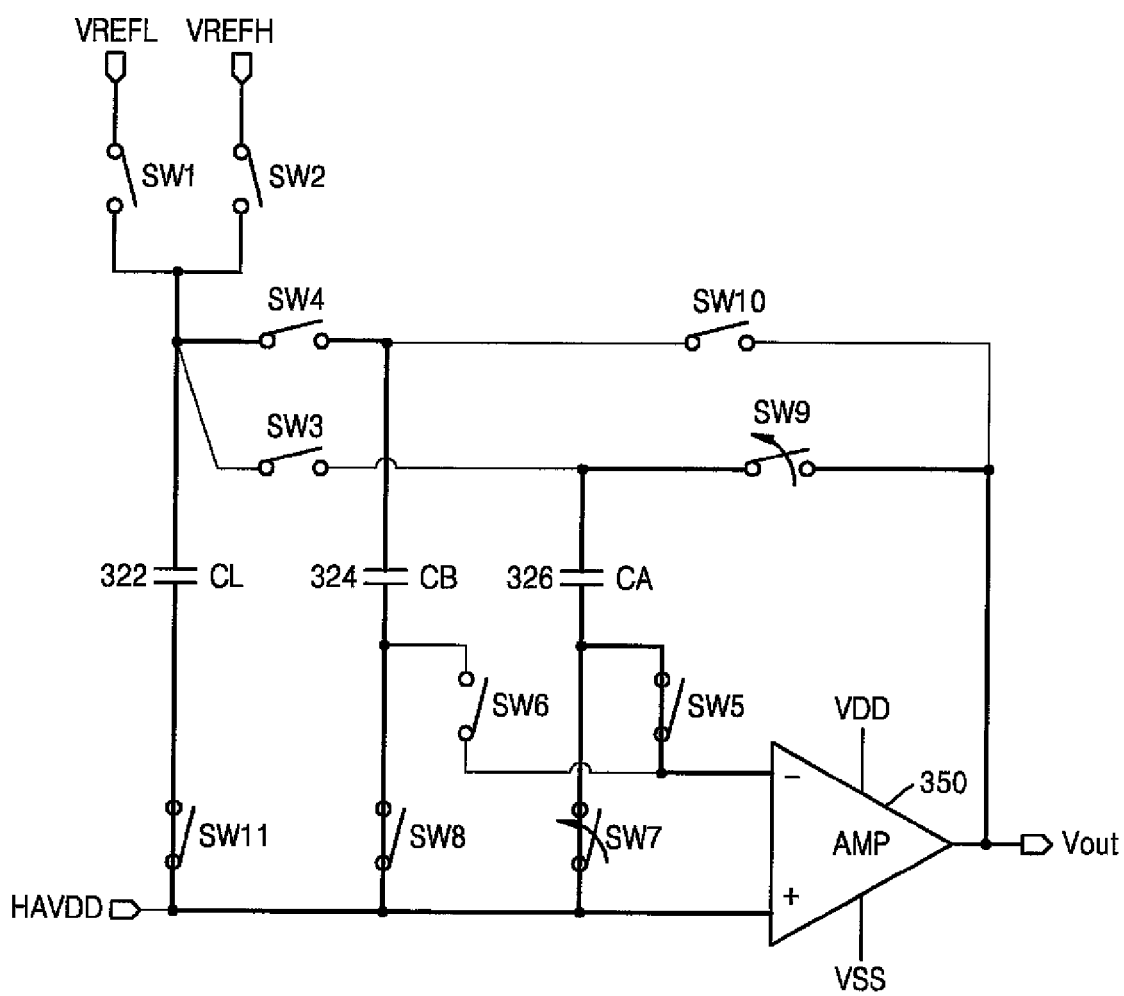
FIG. 5B is a diagram illustrating operations of the cyclic digital to analog converter illustrated in FIG. 3 during section (b) of FIG. 4, according to an embodiment of the present invention.

FIG. 5B is a diagram illustrating operations of the CDAC 300 of FIG. 3 during section (b) of FIG. 4.

When the first CDAC block 320 completes the calculating of the digital signal and is prepared to output the sampled value to the amplifier 350, the second CDAC block 340 starts to calculate an analog value of a digital signal received. That is, the CDAC 300 enters section (b) of FIG. 4. During the transition period, the seventh switch SW7 is turned on and the ninth switch SW9 is turned off. Also, an output of the amplifier 350 is quickly reset to the reference voltage HAVDD, meaning that the reset is performed very quickly, for example, within hundreds of nanoseconds.

As described above, the reference voltage HAVDD may be an intermediate value of an operation voltage range of the amplifier 350. The quick reset is performed so that the voltage of the – input terminal of the amplifier 350 becomes the highest power supply voltage VDD or the lowest power supply voltage VSS, when a feedback capacitor (the third capacitor 326), connecting the input terminal and the output terminal of the amplifier 350, is exchanged.

Figure 5C:
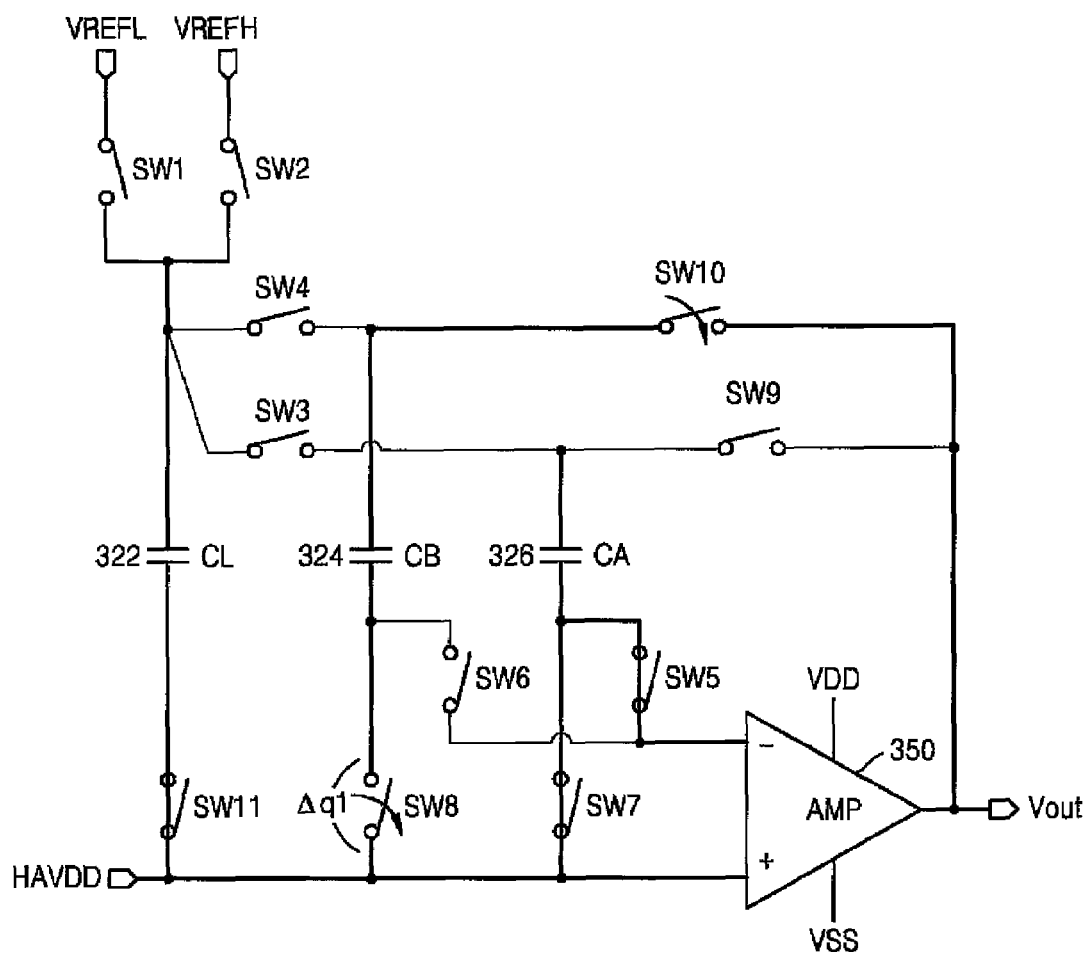
FIG. 5C is a diagram illustrating operations of the cyclic digital to analog converter illustrated in FIG. 3 during section (c) of FIG. 4, according to an embodiment of the present invention.

FIG. 5C is a diagram illustrating operations of the CDAC 300 of FIG. 3 during section (c) of FIG. 4.

When the reset is complete, the eighth switch SW8 is turned off and the tenth switch SW10 is turned on. That is, the CDAC 300 enters section (c) of FIG. 4. At this time, when the eighth switch SW8 is turned off, a connection between the third node N3 and the sixth node N6 is opened. The third node N3 and the sixth node N6 each becomes a floating node and generates a charge injection error. Accordingly, charge (e.g., as much as q1) flows into the third node N3. This generates a small voltage difference to the entire CDAC 300, and thus causes non-linearity to input/output characteristics.

Figure 5D:
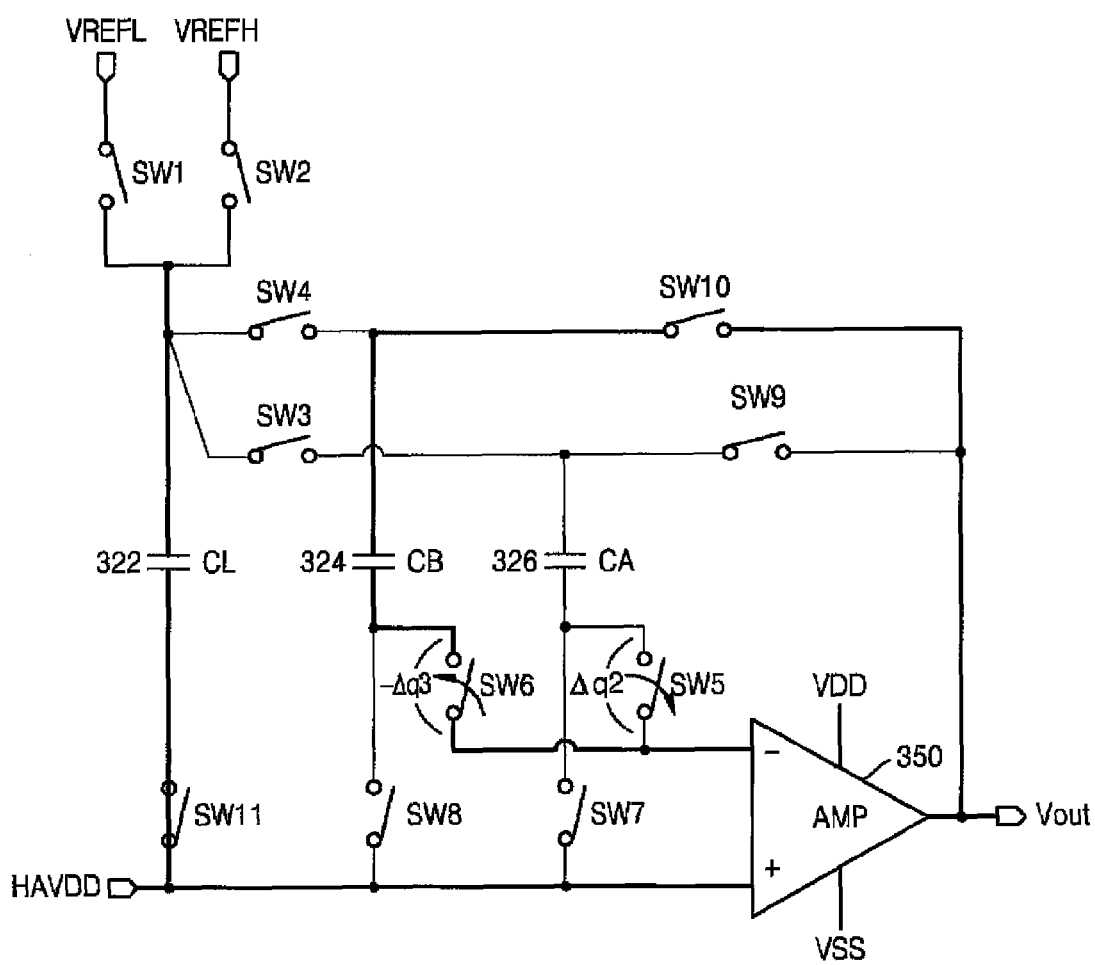
FIG. 5D is a diagram illustrating operations of the cyclic digital to analog converter illustrated in FIG. 3 during section (d) of FIG. 4, according to an embodiment of the present invention.

FIG. 5D is a diagram illustrating operations of the CDAC 300 of FIG. 3 during section (d) of FIG. 4.

In section (d) of FIG. 4, the fifth switch SW5 is turned off and the sixth switch SW6 is turned on. Accordingly, the second capacitor 324 forms a feedback loop by being connected between the – input terminal and the output terminal of the amplifier 350. When the fifth switch SW5 is turned off, a charge injection error occurs. Accordingly, charge (e.g., as much as q2) flows out to the – input terminal of the amplifier 350. Also, when the sixth switch SW6 is turned on, a charge injection error occurs, as illustrated in FIG. 5D. When the sixth switch SW6 is turned on, charge (e.g., as much as q3) flows in.

During sections (c) and (d) of FIG. 4, the charge injection errors occurring in each of the fifth, sixth and eighth switches SW5, SW6 and SW8 compensate for each other and thus disappear. That is, the amounts of the charges generated in each switch can be expressed as Equation 1:

$$\Delta q1 + \Delta q2 - \Delta q3 = 0 \quad (1)$$

Accordingly, the charge injection error occurring in the eighth switch SW8 in section (c) is offset by the sum of the charge injection errors occurring in the fifth and the sixth switches SW5 and SW6 in section (d). Compensation of the charge injection errors and Equation 1 will be described in detail with reference to FIGS. 6A and 6B.

Figure 6A:
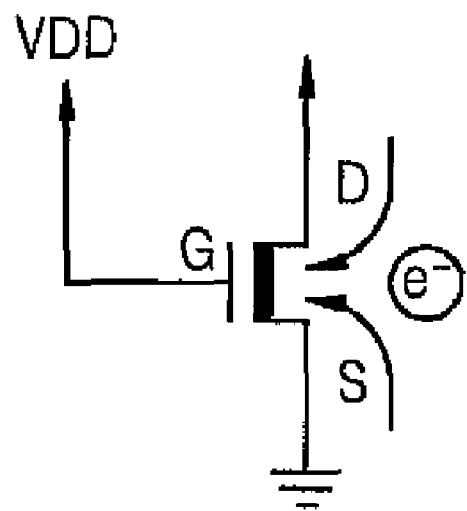
Figure 6B:
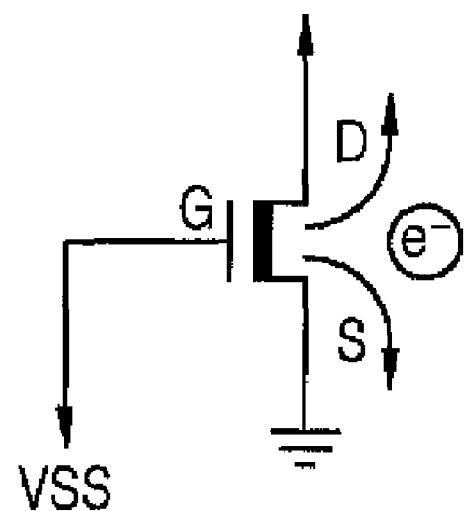
FIG. 6B is a diagram illustrating a charge injection error occurring when a switch is turned off.

In the illustrative embodiment depicted in FIGS. 6A and 6B, an NMOS transistor is used as an example.

FIG. 6A is a diagram for describing a charge injection error occurring when a switch is turned on. Referring to FIG. 6A, when high power supply voltage VDD is applied to a gate G, a uniform charge flows into the gate G. Referring to the amount of charge flowing into one transistor as Q, when the switch is turned on, 0.5Q charge flows in from a direction of a drain D and 0.5Q charge flows in from a direction of a source S. The charge injection error occurs due to a sudden injection of the charge.

FIG. 6B is a diagram for describing the charge injection error occurring when the switch is turned off. Referring to FIG. 6B, when a low power supply voltage VSS is applied to the gate G, a uniform charge flows out to the source S and the drain D. Referring to the amount of charge flowing out from one transistor as Q, when the switch is turned off, 0.5Q charge flows out in the direction of the drain D and 0.5Q charge flows out in the direction of the source S.

According to the CDAC 300, the fifth, sixth and eighth switches SW5, SW6 and SW8 may be devices having the same specifications, as described above. Having the same specifications includes, for example, conditions such as Cox, L, W, etc., being equal.

The amount of charge Q flowing out when the switch is turned off is equal to the amount of charge Q flowing in when the switch is turned on. A feedback loop is formed by connecting the – input terminal of the amplifier 350, the second capacitor 324 and the output terminal of the amplifier 350. A 0.5Q charge flows out to the feedback loop when the eighth switch SW8 is turned off and Q charge flows in when the sixth switch SW6 is turned on. Also, 0.5Q charge flows out to the – input terminal of the amplifier 350 when the fifth switch SW5 is turned off.

Accordingly, referring to Equation 1, when flow in is negative and flow out is positive, the changed amount of the entire charge is 0.5Q+0.5Q–Q=0. That is, according to Equation 1, the total of the amount of charges generated in each of the fifth, sixth and eighth switches SW5, SW6 and SW8 is 0. Therefore, the amount of charges changed by turning on and off these switches is 0, and thus charge injection error can be prevented via the compensation.

As described above, according to embodiments of the present invention, two CDAC blocks of a CDAC share one capacitor, and thus the size of the CDAC is reduced. Also, by reducing operation frequency of the CDAC, power consumption can be reduced. In addition, a charge injection error occurring during a transition period in one CDAC block is compensated for by a charge injection error occurring in another CDAC block, and thus the entire charge injection error can be prevented.

While the present invention has been shown and described with reference to exemplary embodiments thereof, it will be apparent to those skilled in the art that various changes and modifications may be made without departing from the spirit and scope of the present invention. Therefore, it should be understood that the above embodiments are not limiting, but illustrative.

What is claimed is:

1. A cyclic digital to analog converter (CDAC) in a pipeline structure, the CDAC comprising:
    a first CDAC block which receives a first digital signal and converts the first digital signal to a first analog value, the first CDAC block comprising a charging capacitor for charging according to the first digital signal and a first storing capacitor for storing the first analog value; and
    a second CDAC block which receives a second digital signal and converts the second digital signal to a second analog value, the second CDAC block comprising the charging capacitor for charging according to the second digital signal and a second storing capacitor for storing the second analog value;

wherein the first CDAC block and the second CDAC block share the charging capacitor.

2. The CDAC of claim 1, wherein the first digital signal and the second digital signal are consecutively received.

3. The CDAC of claim 2, wherein the second CDAC block outputs the second analog value while the first CDAC block receives the first digital signal and calculates the first analog value, or the first CDAC block outputs the first analog value while the second CDAC block receives the second digital signal and calculates the second analog value.

4. The CDAC of claim 1, further comprising:
an amplifier which receives, amplifies and outputs a reference voltage signal and at least one of the first analog value and the second analog value output from the first CDAC block and the second CDAC block, respectively.

5. The CDAC of claim 4, further comprising:
a plurality of switches respectively connecting the first CDAC block and the second CDAC block to an output terminal of the amplifier, the plurality of switches being turned on or turned off in response to a corresponding plurality of switching control signals.

6. The CDAC of claim 4, further comprising:
an input unit connected to the charging capacitor, the input unit receiving the first digital signal and the second digital signal and sending the received first digital signal and the second digital signal to the first CDAC block and the second CDAC block, respectively, each of the first digital signal and the second digital signal comprising one of a logic high level or a logic low level.

7. The CDAC of claim 4, wherein the charging capacitor is connected between a first node, which receives the first digital signal and the second digital signal, and a sixth node, which is an input terminal of the amplifier.

8. The CDAC of claim 7, wherein the first CDAC block further comprises:
an eighth switch connected between the sixth node and the first storing capacitor, the eighth switch being turned on or off in response to an eighth switching control signal
a fourth switch connected between the first node and the first storing capacitor, the fourth switch being turned on or off in response to a fourth switching control signal; and
a sixth switch connected between the first storing capacitor and a second input terminal of the amplifier, the sixth switch being turned on or off in response to a sixth switching control signal.

9. The CDAC of claim 8, wherein the first input terminal of the amplifier receives a reference voltage, which has a value within an operation voltage range of the amplifier.

10. The CDAC of claim 9, wherein the reference voltage value comprises an intermediate value of the operation voltage range.

11. The CDAC of claim 9, wherein the second CDAC block comprises:
a seventh switch connected between the sixth node and the second storing capacitor, the seventh switch being turned on or off in response to a seventh switching control signal;
a third switch connected between the first node and the second storing capacitor, the third switch being turned on or off in response to a third switching control signal; and
a fifth switch connected between the seventh switch and the second input terminal of the amplifier, the fifth switch being turned on or off in response to a fifth switching control signal.

12. The CDAC of claim 11, further comprising:
a ninth switch connected between the second storing capacitor and an output terminal of the amplifier, the ninth switch comprising an output node of the second CDAC block; and
a tenth switch connected between the first storing capacitor and the output terminal of the amplifier, the tenth switch comprising an output node of the first CDAC block.

13. The CDAC of claim 6, wherein the input unit comprises:
a first switch connected between a low voltage level signal source and the charging capacitor, the first switch being turned on or off in response to a first switching control signal; and
a second switch connected between a high voltage level signal source and the charging capacitor, the second switch being turned on or off in response to a second switching control signal.

14. The CDAC of claim 12, wherein the third through tenth switching control signals are supplied from an LCD controller or are individually input, and respectively regulate the third through tenth switches according to an operation status of the CDAC.

15. The CDAC of claim 12, wherein each of the third through tenth switches comprises one of an NMOS transistor or a PMOS transistor.

16. The CDAC of claim 12, wherein each of the third through tenth switches comprises a transmission gate.

17. The CDAC of claim 15, wherein the fifth, sixth and eighth switches comprise identical MOS transistors.

18. The CDAC of claim 16, wherein the fifth, sixth and eighth switches comprise identical transmission gates.

19. The CDAC of claim 8, wherein the first CDAC block further comprises:
an eleventh switch connected between the charging capacitor and the sixth node, wherein the eleventh switch is regulated to be always turned on while the CDAC operates.

20. A cyclic digital to analog converter (CDAC) in a pipeline structure, the CDAC comprising:
a first CDAC block which receives a first digital signal and converts the first digital signal to a first analog value;
a second CDAC block which receives a second digital signal and converts the second digital signal to a second analog value; and
an amplifier connectable to the first CDAC block and the second CDAC block, the amplifier receiving the first analog value from the first CDAC block and the second analog value from the second CDAC block through an input terminal and outputting an amplified analog value by differentially amplifying the received first analog value or the received second analog value with a reference voltage,
wherein the first CDAC block comprises:
a first capacitor comprising one terminal that receives the first digital signal and an other terminal connected to a sixth node, which receives the reference voltage, the first capacitor charging according to the first digital signal;
a fourth switch comprising one terminal connected to the one terminal of the first capacitor;

a second capacitor comprising one terminal connected to an other terminal of the fourth switch, the second capacitor storing the first analog value;

a sixth switch comprising one terminal connected to an other terminal of the second capacitor and an other terminal connected to the amplifier input terminal; and an eighth switch comprising one terminal connected to the other terminal of the second capacitor and an other terminal connected to the sixth node; and wherein the second CDAC block comprises:

the first capacitor, which receives the second digital signal and charges according to the second digital signal;

a third switch comprising one terminal connected to the one terminal of the first capacitor;

a third capacitor comprising one terminal connected to an other terminal of the third switch, the third capacitor storing the second analog value;

a fifth switch comprising one terminal connected to an other terminal of the third capacitor and an other terminal connected to the amplifier input terminal; and a seventh switch comprising one terminal connected to the other terminal of the third capacitor and an other terminal connected to the sixth node.

21. The CDAC of claim 20, further comprising:
a ninth switch comprising one terminal connected to the other of the third switch and an other terminal connected to an output terminal of the amplifier; and
a tenth switch comprising one terminal connected to the other terminal of the fourth switch and an other terminal connected to the output terminal of the amplifier.

22. The CDAC of claim 21, wherein an operation cycle comprises:
a first time interval; and
a second time interval,
wherein the eighth switch is turned off and the tenth switch is turned on during the first time interval, and
the sixth switch is turned on and the fifth switch is turned off during the second time interval.

23. The CDAC of claim 22, wherein the second time interval follows the first time interval.

24. The CDAC of claim 23, wherein a charge injection error occurring when the eighth switch is turned off during the first time interval, is compensated for by charge injection errors respectively occurring when the fifth switch is turned off and the sixth switch is turned on during the second time interval.

25. The CDAC of claim 21, wherein the third through tenth switches are turned on or off in response to third through tenth switching control signals, respectively.

26. The CDAC of claim 25, wherein the third through tenth switching control signals are supplied from an LCD controller or individually input, and respectively regulate the third through tenth switches according to an operation status of the CDAC.

27. The CDAC of claim 23, wherein the fifth and seventh switches are on and the third, fourth, sixth and ninth switches are off during the first time interval.

28. The CDAC of claim 27, wherein the third, fourth and eighth switches are off and the seventh and tenth switches are on during the second time interval.

* * * * *